United States Patent [19]

Andrews

[11] Patent Number: 4,890,300
[45] Date of Patent: Dec. 26, 1989

[54] RADIO TRANSMITTERS

[75] Inventor: Christopher J. Andrews, Berkshire, England

[73] Assignee: Racal Communications Equipment Limited, Berkshire, England

[21] Appl. No.: 185,788

[22] Filed: Apr. 25, 1988

[30] Foreign Application Priority Data

Apr. 28, 1987 [GB] United Kingdom ............... 8709998

[51] Int. Cl.$^4$ ............................................. H04L 25/49
[52] U.S. Cl. ....................................... 375/60; 455/63; 455/115
[58] Field of Search ................. 375/60, 10; 455/115, 455/109, 63, 104, 103, 47

[56] References Cited

U.S. PATENT DOCUMENTS

| | | | |
|---|---|---|---|
| 4,025,855 | 5/1977 | Atkinson | 455/109 |
| 4,165,493 | 8/1979 | Harrington | 455/115 |
| 4,238,855 | 12/1980 | Zborowski | 455/103 |
| 4,422,047 | 12/1983 | Wright | 455/115 |
| 4,491,973 | 1/1985 | Idol | 455/115 |

FOREIGN PATENT DOCUMENTS

| | | |
|---|---|---|
| 0040127 | 11/1981 | European Pat. Off. |
| 0149319 | 11/1984 | European Pat. Off. |
| 0190073 | 8/1986 | European Pat. Off. |
| 1381597 | 1/1975 | United Kingdom |
| 1419519 | 12/1975 | United Kingdom |
| 1565153 | 4/1980 | United Kingdom |
| 2153173 | 8/1985 | United Kingdom |

OTHER PUBLICATIONS

Comsat Technical Review, vol. 15, No. 2, Part A, 1985, pp. 309 to 341, Washington U.S. "Linearised Transponder Technology for Satellite Communications, Part II: System Simulation and Performance Assessment": Y. S. Lee et al.

Primary Examiner—Robert L. Griffin
Assistant Examiner—Marianne Huseman
Attorney, Agent, or Firm—Leydig, Voit & Mayer

[57] ABSTRACT

A radio transmitter includes a bank of pre-distortion circuits each of which is selectively connectable between the mixing stages of the transmitter and the final linear power amplifier stage of the transmitter. The pre-distortion circuit to be connected is determined by the RF frequency of the signal to be transmitted. A method of analyzing the distortion produced by a linear power amplifier is also described. In this method two tones are applied to the amplifier and the resulting down-mixed signal is subjected to a FET in order to derive the spectrum and plot the amplitude and phase distortion against the two tone amplitude. Analysis of the results of such testing allows the pre-distortion circuits to be designed to compensate for distortion produced by the amplifier over the complete operating frequency range of the transmitter.

5 Claims, 3 Drawing Sheets

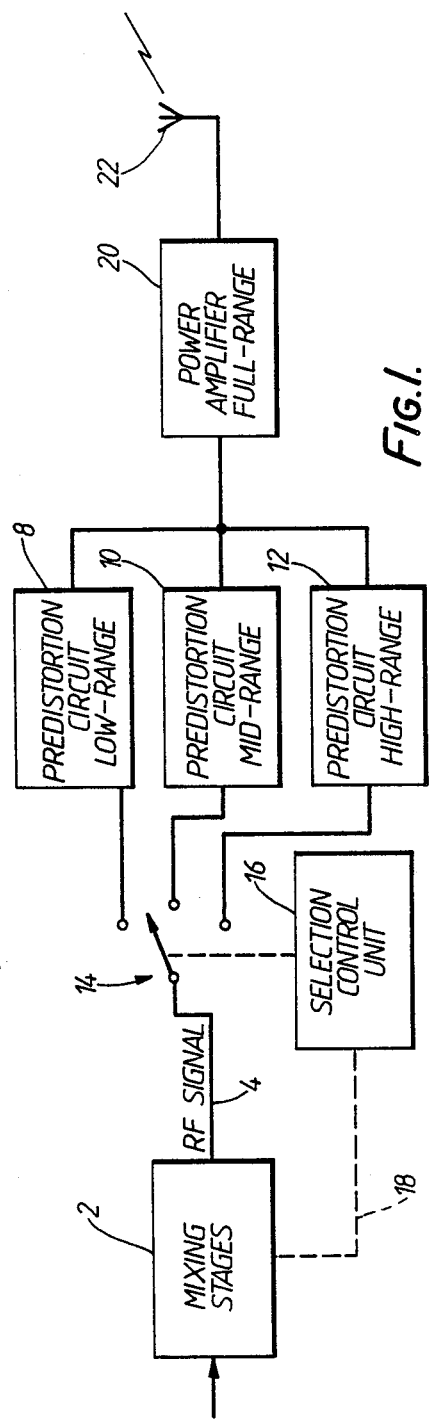
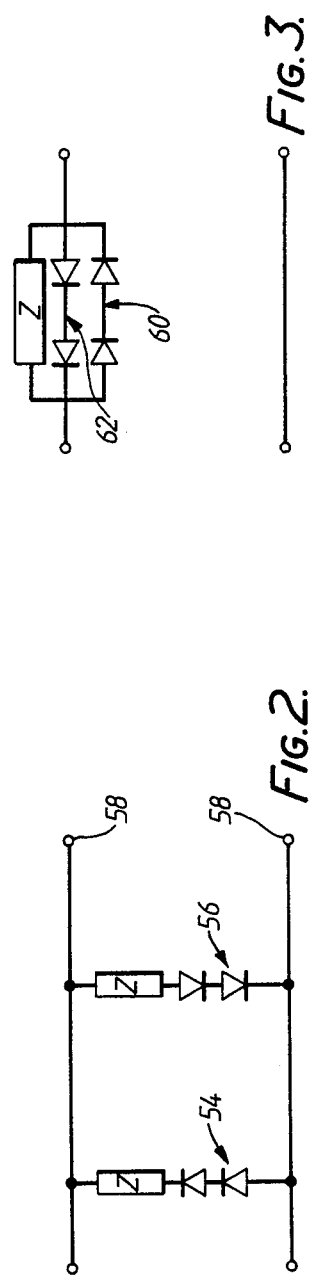

RADIO TRANSMITTERS

BACKGROUND OF THE INVENTION

1. Technical Field

The present invention relates to radio transmitters and, more specifically, to the final power amplifier stage of high frequency (HF) radio transmitters.

When a transmitter is required to transmit a signal which contains components at several distinct frequencies, non-linearities in the final power amplifier give rise to intermodulation products (IMPs) at the output of the amplifier at frequencies other than those present in the input signal. The IMPs therefore distort the output and hence cause interference in adjacent channels. This effect gives rise to a significant technical problem where the frequency of the input signal to the final power amplifier stage represents information, for example if the input signal is the output of a parallel tone modem, or where the transmitter is being used to transmit several different signals at the same carrier frequency, as in an independent sideband mode of operation. For such purposes, a typical specification requires that any IMPs should be reduced by at least −35 dB relative to the wanted signals. Although it is possible to achieve this with amplifiers using valves, it has hitherto been difficult and impractical to produce IMPs reduced by more than −30 dB with solid state class B linear amplifiers operating at radio frequencies.

2. Prior Art

Typically, attempts have been made to reduce distortion in such amplifiers by the use of inverted feedback techniques and a number of amplifier stages, in order to compensate for the reduction in gain produced by the negative feedback. Improvements may also be obtained by carefully selecting the biasing conditions of the transistors used. Such design considerations are well discussed in the literature. However, such techniques have been found ineffective in meeting the high specifications required.

SUMMARY OF THE INVENTION

An object of the invention is to provide a radio transmitter which is capable of suppressing intermodulation products to better than −30 dB over a wide frequency range, for example the whole HF range.

The present invention accordingly provides a radio transmitter including a transmitter input for receiving a signal at a variable radio frequency for transmission, a linear power amplifier for amplifying said signal and having an input and an output, a plurality of pre-distortion circuits each having an input and an output, said outputs of said pre-distortion circuits each being connectable to said amplifier input and said inputs of said pre-distortion circuits each being connectable to said transmitter input, and means connecting said transmitter input via one only of said pre-distortion circuits to said amplifier for selectively applying said signal to a pre-distortion circuit selected in dependence on said frequency of said signal, each pre-distortion circuit being adapted to produce a distortion for a specific frequency range which is substantially equal and opposite to the distortion produced by the amplifier for that frequency range so that signals within each of the ranges are substantially undistorted at the output of the amplifier.

The use of a bank of pre-distortion circuits, together with means for selecting the required circuit at any time in dependence on the frequency range of the input signal, allows the transmitter to be used for transmitting signals over a wide frequency range without the intermodulation products causing unacceptable distortion.

The technique of pre-distortion is known in the art of electronic circuit design. For example, it has been proposed to use pre-distortion circuits interposed between a signal source and a transmission line so that the distortion imposed on the signal as it is transmitted along the line can be compensated allowing the signal to be correctly received. However, it is believed that such pre-distortion circuits have always hitherto been used in applications where the signal to be pre-distorted has a known fixed frequency. Pre-distortion circuits have in particular been widely used in power amplifiers for TV transmitters. Examples of the use of pre-distortion in this context are to be found in GB-A-2 153 173, GB-A-1 419 519 and GB-A-1 381 597. Of course, in such television transmitter amplifiers the carrier frequency is maintained constant although the bandwidth of the signal being transmitted is wide. The pre-distortion circuits described in these specifications are all permanently in circuit even where, as in GB-A-2 153 173, several different pre-distortion paths are provided.

For the purposes of the transmitter of the present invention, it is required to provide a technique for correcting for the effect of IMPs when the transmitter may be able to operate at any frequency within a wide frequency range. In order that this may be possible, it is necessary to be able to accurately measure the distortion over the whole frequency range of the amplifier. It is therefore another object of this invention to provide a novel technique for carrying out this measurement, which enables this invention to be put into effect.

In accordance with another aspect of the invention, there is provided a method of testing an amplifier in order to establish its distortion characteristics due to intermodulation products, including the steps of generating two signal tones to be fed simultaneously to the amplifier under test, mixing the output of the amplifier with a local oscillator frequency, sampling the voltage at the output of the mixer periodically, and carrying out a Fourier transform on the samples, in order to derive amplitude and phase information for a plurality of sample frequencies within the amplifier output, identifying distorting IMPs and determining the phase and amplitude distortion produced thereby relative to the amplitude of the vector sum of the two tones, and repeating the preceding steps for pairs of tones throughout the frequency range of the amplifier.

Using such a test, it is possible to identify the intermodulation products due to non-linear gain, and plot changes in phase and amplitude with signal amplitude which result in the distortion of the input signal throughout the frequency range. The appropriate types of pre-distortion circuits suitable for offsetting these effects can then be selected for incorporation into the transmitter so that, whatever the radio frequency of the signal to be transmitted, the input to the amplifier can be routed through an appropriate pre-distortion circuit in order to minimise the intermodulation products. Typically, it has been found that a bank of three pre-distortion circuits can cover the whole HF range (e.g. 1.6 to 30 MHz) and ensure that all order IMPs are reduced to at least −40 dB. However it is preferred to repeat the test for more than three frequencies from the range of the amplifier.

An HF radio transmitter and a method of measuring the distortion of the power amplifier in accordance with the invention will now be described, by way of example only, with reference to the accompanying diagrammatic drawings.

BRIEF DESCRIPTION OF THE DRAWINGS

FIG. 1 is a block diagram of the HF transmitter;

FIG. 2 is a pre-distortion circuit for compensating a first type of distortion;

FIG. 3 is a pre-distortion circuit for compensating a second type of distortion;

DESCRIPTION OF A PREFERRED EMBODIMENT

Figure 4:
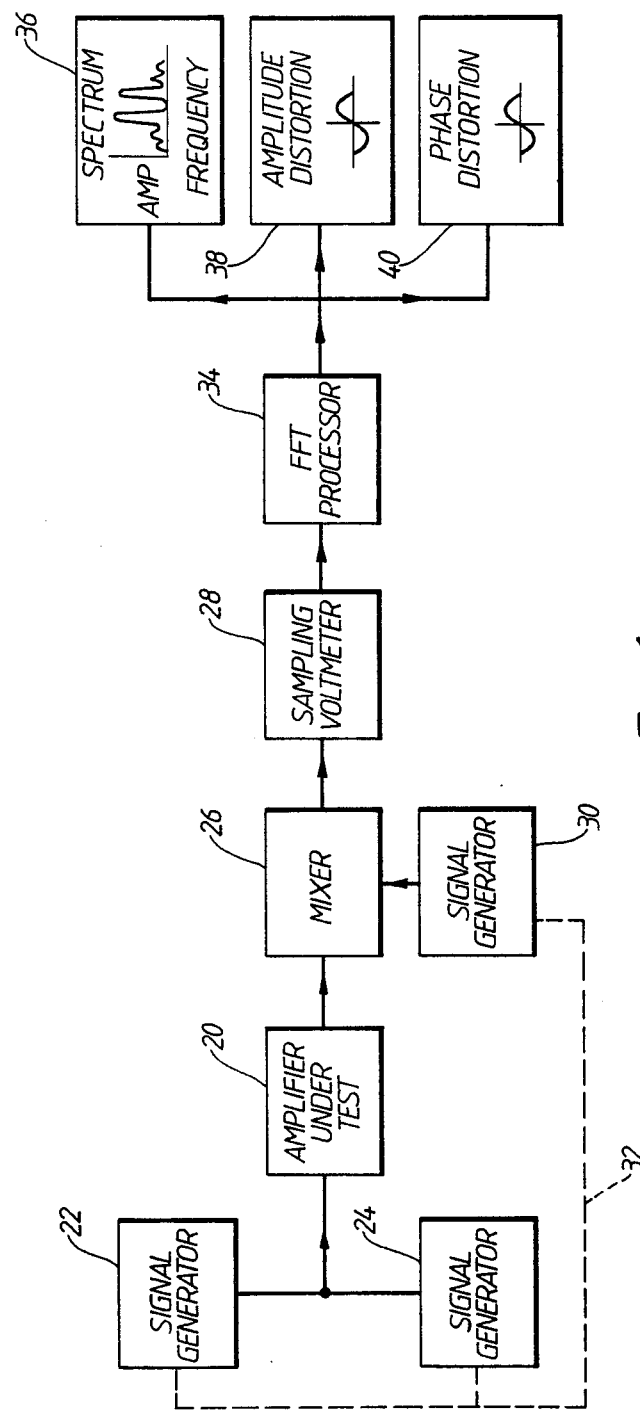
FIG. 4 is a test set-up for use in designing the transmitter of FIG. 1.

An HF radio transmitter as illustrated in FIG. 1 includes essentially conventional mixing stages 2 for converting an input signal, such as a voice signal or the output of a parallel tone modem, into an RF signal at an output 4. The output RF signal is passed to one of a bank of three pre-distortion circuits 8,10,12 via a selection switch 14, the position of which is controlled by a selection control unit 16. The outputs of all three pre-distortion circuits are connected to an input of a power amplifier 20. The output of the power amplifier is connected to an antenna 22 for transmission.

The selection control unit is shown as connected via a control line 18 to the mixing stages 2 in order to indicate that the setting of the selection switch 14 is determined by the RF frequency of the output signal as determined by the user. The desired RF frequency of the output is, of course, used to determine the local oscillator frequencies employed during the mixing stages 2. The input means employed by the user to set the RF frequency and, therefore the local oscillator frequencies in the mixing stages may also be connected to control the selection switch. Each pre-distortion circuit is capable of producing a required mixture of amplitude and phase distortion, as determined by the previously measured distortion produced within each frequency range by the power amplifier 20, for a particular portion of the frequency range of the amplifier 20.

Because of the presence of the pre-distortion circuits, the output of the power amplifier is an amplified, but otherwise substantially identical, version of the RF signal presented at the output 4 of the mixing stages 2. In order to determine the appropriate design of the pre-distortion circuits 8, 10, and 12 and the number of such pre-distortion circuits required, it is necessary to measure the types of distortion produced by the amplifier 20 accurately throughout its operating frequency range. This may be done by employing the apparatus illustrated in FIG. 4, which will now be described.

FIGS. 2 and 3 show suitable designs for the pre-distortion circuits 8, 10 or 12. The value and type (resistor, inductor, capacitor or combination thereof) of the impedances Z employed is determined by the distortion to be corrected as will be described in more detail later.

The amplifier 20 is typically a class B linear amplifier designed using solid state components. For testing purposes, the input signal is chosen as two RF tones at slightly different frequencies separated by, for example, 2 kHz so as to generate intermodulation products, which are the particular concern of the present invention. It will be appreciated that the amplifier may also be subject to other types of distortion, such as distortion due to harmonics. The pre-distortion circuits may be able to compensate for such alternative types of distortion to some extent at the same time as dealing with the IMPs.

A two tone input to the amplifier 20 is provided by two signal generators 22, 24 operating at two distinct frequencies separated by, say, 2 kHz in the HF range. The output of the amplifier is fed via a mixer 26 to a sampling voltmeter 28. The mixer 26 is provided with its second input from a signal generator 30 set to a suitable frequency to produce an output in which the two input tones generated by the signal generators 22 and 24 are mixed down to 20 kHz and 22 kHz respectively. It will be appreciated that these figures are given by way of example only and other appropriate test conditions may readily be selected in dependence upon the intended application of the HF transmitter.

The frequency standards of the generators 22, 24 and 30 are connected together as shown by the dotted control line 32.

The sampling voltmeter produces digital samples of the mixed down output of the amplifier 20. The samples are fed to a computer 34 which is programmed to perform a Fourier transform on the output signal using a FFT algorithm, and also to further process the results of the FFT in order to produce plots of the spectrum of the output signal, the amplitude distortion and the phase distortion on displays or as print-outs as shown by blocks 36,38,40. It will be appreciated that these functions can readily be carried out by suitable programmes which need not be described in detail herein except for the functions which they perform which are set out more fully below.

Since the sampling voltmeter 28 may be limited in its sampling rate, it may be necessary to sample at time intervals so that each successive sample of the waveform is actually taken from a following cycle of the signal rather than the same cycle. This produces the same results since the individual cycles, though subject to distortion, will be identical. Thus, if the FFT is to use 512 (2N) samples over a period (T) of 2 ms, samples should be taken every 0.0039 ms. However, provided all the significant frequency components are multiples of 1 kHz samples may be taken at every 1.0039 ms instead. This will enable the signal output from the mixer 26 to be analysed over a frequency range of 128 kHz. This is actually a larger range than may be considered strictly necessary but arises because of the requirement of the FFT algorithm to have a number of samples which is a power of 2. For the purposes of the present invention analysis of distortion due to IMPs up to the 7th order is generally all that is necessary, since higher order IMPs produce distortions which are already of a sufficiently low level and do not require further compensation. The output of the FFT contains amplitude and phase information for each of 256 (N) sample frequencies within the analysis range of 0.5 kHz to 128 kHz in steps of 0.5 kHz (1/T). The first output from the processor 34 on display 36, which may be a CRT or plotter or both, is the spectrum of the output signal, that is the amplitude of each sample frequency versus frequency. If there is no distortion produced by the amplifier 20, this will show only the two tones at 20 and 22 kHz respectively. However, the spectrum will normally also include IMPs at various levels and harmonics. The third order IMPs will be at 18 and 24 kHz, the fifth order at 16 and 26 kHz and so on.

Figure 5:
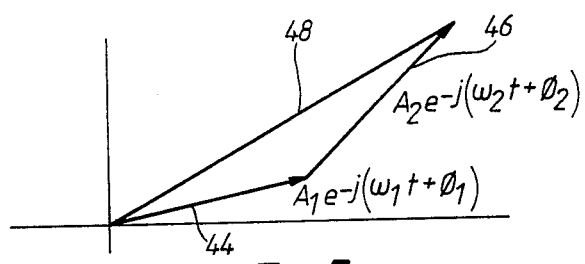
FIG. 5 is a vector diagram for illustrating the input signal to an amplifier to be tested with the apparatus of FIG. 4.

In order to analyse the phase and amplitude information generated by the FFT, it is required to plot the phase and amplitude distortion versus the two tone signal amplitude. Typical such plots are shown in FIGS. 6a–6d for various types of distortion. In order to produce these plots, the programme run by the computer 34 first identifies in the spectrum the two tones and computes the vector sum of these two tones as shown in FIG. 5, where the first tone is identified by the vector 44 which can be expressed as $A_1 e^{-j(\omega_1 t + \phi_1)}$. The second tone is shown by the vector 46 as $A_2 e^{-j(\omega_2 t + \phi_2)}$. In the present example $\omega_1 = 20$ kHz and $\omega_2 = 22$ kHz and $\phi_1$ and $\phi_2$ are the relative phases of the two tones. Where the frequency standards of the signal generators 22 and 24 are connected together $\phi_1 - \phi_2$ will be a constant value. The maximum amplitudes of the signals, $A_1$ and $A_2$ are ideally equal. The vector sum of the two tones 44 and 46 is shown by the vector 48. It will be appreciated that the vector 48 rotates in time and that its amplitude will change as a function of time since the frequencies of its two components are different. The phase of the vector sum 48 of the two tones is used as a reference phase throughout the following analysis.

The average frequency of the two tones, that is 21 kHz in the present example, is also used as a reference frequency. Therefore, relative to this reference, the two tones have frequencies of plus and minus 1 kHz respectively, resulting in their vector sum 48 having a constant phase.

The computer programme identifies from the output of the FFT those sample frequencies at which there is a large signal, that is one having an amplitude greater than a predetermined threshold value. The threshold may be determined by reference to the amplitude of the signals at the sample frequencies corresponding to the input tones and the required level to which all IMPs are to be reduced as determined by the design specification for the amplifier. Only signals which are at IMP frequencies (e.g. ±3 kHz, ±5 kHz etc.) are used in the following calculations. The other large signals are monitored just as a check on the test. There should be no large signals except the IMPs and the harmonics. The phase of these IMPs relative to the reference phase is then computed. From this information it is possible to calculate the vector sum of the IMPs for a number of points, typically 200 during a 1 millisecond period, which corresponds to 1 kHz and therefore covers a complete cycle of the vector sum of the two tones. The component of the vector sum of the IMPs which is in phase with the vector sum of the two tones is then computed. This component represents the amplitude distortion and is plotted against the two tone amplitude for the purposes of the display or printout 38. The component of the vector sum of the IMPs at 90° to the reference phase represents the phase distortion. This is plotted against the two tone amplitude for output 40.

There are four basic shapes for these plots. However, any particular amplifier under test may produce modifications of these shapes. The two basic shapes of the amplitude distortion plots are shown on the right hand side in FIGS. 6a and 6b with the effect they have on the actual waveform shown on the left hand side where voltage is plotted against time, the solid line waveforms 50 showing the ideal, undistorted waveform, and the dotted line 52 showing the distorted waveform.

Figure 6A:
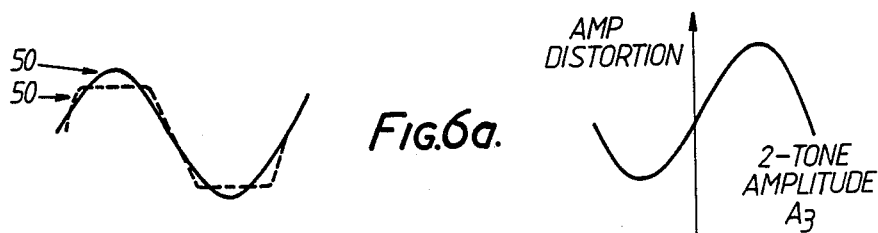
FIGS. 6a to 6d show, on the left hand side amplitude versus time plots of various distorted output signals from an amplifier fed with two tones as in the apparatus of FIG. 4, and, on the right hand side, corresponding plots of the amplitude or phase distortion relative to the two tone amplitude.

As shown in FIG. 6a, there is positive amplitude distortion at low levels of the two tone amplitude and negative amplitude distortion at high levels. This is caused by the gain of the amplifier 20 decreasing with amplitude as can be seen by a comparison of the waveforms 50 and 52 on the left hand side of FIG. 6a.

Figure 6B:
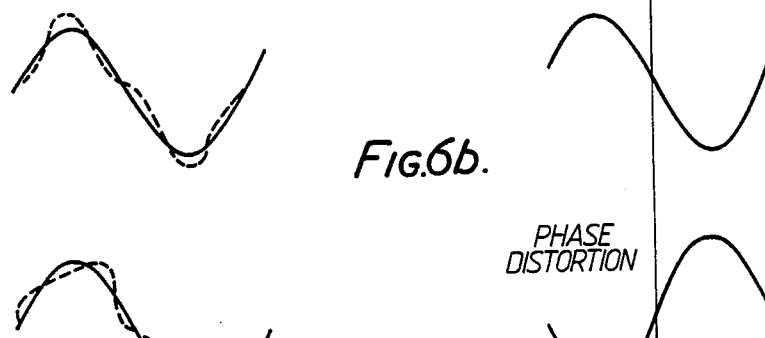

The amplitude distortion plot shown in FIG. 6b shows the result of gain decreasing with amplitude. This type of distortion is known as cross over distortion.

Figure 6C:
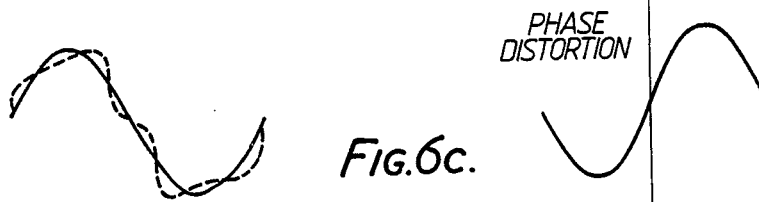
Figure 6D:
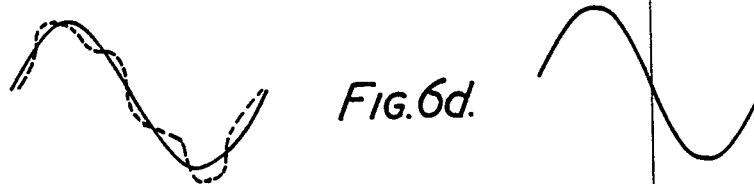

Similar plots for phase distortion are shown in FIGS. 6c and 6d. In FIG. 6c the distortion is due to the delay through the amplifier increasing with the amplitude of the signal. The reverse situation is illustrated in FIG. 6d.

Plots of the spectrum as shown on display 36, the amplitude distortion plot as shown on display 38 and the phase distortion plot as shown on display 40 are obtained and preferably printed for two tones generated by the signal generators 22 and 24 at various points in the frequency range of the amplifier 20. A plot of the waveform in time may also be generated if required to measure the frequency. These results can then be analysed to determine how best to design the predistortion circuits in order to compensate for the types of distortion found at various frequencies within the operating range of the amplifier. Typically it will be necessary to separate this operating range into a number of sub-ranges which have different distortion characteristics. For each range a suitable predistortion circuit is designed which gives the opposite change in gain and phase with amplitude to that produced by the amplifier 20.

A simple and effective way of producing distortion is to use pairs of diodes and impedances. A circuit as shown in FIG. 2 will compensate for the cross over type of amplitude distortion illustrated in FIG. 6b, if the impedances Z are suitable resistances. At low amplitudes, where the diodes 54 and 56, which are preferably Schottky diodes, are non-conducting, the output voltage across terminals 58 is not affected by the predistortion circuit, whereas at higher voltages or amplitudes at which the diodes conduct, the resistance produces a greater attenuation to offset the increased grain of the amplifier. The value of the resistance is determined by the amount by which the gain increases with amplitude.

The circuit shown in FIG. 3 corrects for the type of distortion illustrated in FIG. 6a when the impedance Z is a resistance. In this case the circuit has no effect when the diodes 60, 62 are conducting but has the effect of decreasing the gain at low amplitudes when the diodes are off.

Corrections can be made to the phase distortion by the use of similar circuits in which Z is an inductance or a capacitance. Thus the shunt circuit of FIG. 2 gives a phase change when the diodes turn on and the series circuit of FIG. 3 gives a phase change when the diodes turn off. For the type of phase distortion illustrated in FIG. 6c, the necessary correction can be achieved by the use of inductors in either the circuit of FIG. 2 or FIG. 3. Normally since amplitude distortion will need to be corrected at the same time, this determines the choice of the type of circuit between FIGS. 2 and 3 and a resistive inductor will be used as the impedance Z.

The use of a capacitive impedance will compensate for the type of phase distortion illustrated in FIG. 6d.

Pre-distortion circuits may also be designed using the circuits shown in FIGS. 2 and 3 in series with the values of Z selected in accordance with the type of distortion measured using the apparatus shown in FIG. 4.

The results derived from the use of the apparatus shown in FIG. 4 may also be used to assist the design of the amplifier 20 by appropriate choice of bias current and selection of components.

I claim:

1. A radio transmitter including
a transmitter input for receiving a signal at a variable radio frequency for transmission,
a linear power amplifier for amplifying said signal and having an input and an output,
a plurality of pre-distortion circuits each having an input and an output, said outputs of said pre-distortion circuits being connectable to said amplifier input and said inputs of said pre-distortion circuit each being connectable to said transmitter input, and
means connecting said transmitter input via only one of said pre-distortion circuits to said amplifier input for selectively applying said signal to a said pre-distortion circuit selected in dependence on said frequency of said signal,
each pre-distortion circuit being adapted to produce a distortion for a specific fequency range which is substantially equal and opposite to the distortion produced by the amplifier for that frequency range so that signals within each of the ranges are substantially undistorted at the output of the amplifier.

2. A radio transmitter according to claim 1, further including at least one mixing state for converting an input signal into said radio frequency signal, each mixing stage including a local oscillator the output frequency of which is settable by a user, and in which said means for connecting said signal to the input of only one of said pre-distortion circuits is controlled by the setting of at least one of the local oscillator frequencies.

3. A radio transmitter according to claim 1, in which the pre-distortion circuits are selected to compensate for the types of distortion identified by submitting the linear power amplifier to a test method including the steps of generating two signal tones to be fed simultaneously to the amplifier under test, mixing the output of the amplifier with a local oscillator frequency, sampling the voltage at the output of the mixer periodically, and carrying out a Fourier transform on the samples in order to derive amplitude and phase information for a plurality of sample frequencies within the amplifier output, identifying distorting IMPs and determining the phase and amplitude distortion produced thereby relative to the amplitude of the vector sum of the two tones, and repeating the preceding steps for pairs of tones throughout the frequency range of the amplifier.

4. A method of testing a linear power amplifier for use in a radio transmitter in order to establish its distortion characteristics due to intermodulation products, the method including the steps of generating two signal tones to be fed simultaneously to the linear power amplifier under test, mixing the output of the amplifier with a local oscillator frequency, sampling the voltage at the output of the mixer periodically, and carrying out a Fourier transform on the samples in order to derive amplitude and phase information for a plurality of sample frequencies within the amplifier output, identifying distorting IMPs and determining the phase and amplitude distortion produced thereby relative to the amplitude of the vector sum of the two tones, and repeating the preceding steps for pairs of tones throughout the frequency range of the amplifier.

5. A method according to claim 4, in which the step of determining the phase and amplitude distortion comprises the steps of determining the vector sum of the distorting IMPs and plotting its components in phase with and at 90° to the vector sum of the two tones, against the amplitude of the two tones over a time period during which the two tone amplitude completes a cycle, in order to derive plots of the amplitude and phase distortion respectively.

* * * * *